(12) United States Patent
Sagar et al.

(10) Patent No.: US 12,035,515 B2
(45) Date of Patent: Jul. 9, 2024

(54) UHD HDR IP CLIENT DEVICE

(71) Applicant: ARRIS Enterprises LLC, Suwanee, GA (US)

(72) Inventors: Robert Sagar, West Yorkshire (GB); James Anderson, Suwanee, GA (US); Brian M. Carroll, Quakertown, PA (US); Ian Clarke, Shipley (GB); Qiang Bai, Shipley (GB)

(73) Assignee: ARRIS ENTERPRISES LLC, Horsham, PA (US)

( * ) Notice: Subject to any disclaimer, the term of this patent is extended or adjusted under 35 U.S.C. 154(b) by 156 days.

(21) Appl. No.: 17/669,782

(22) Filed: Feb. 11, 2022

(65) Prior Publication Data

US 2022/0346289 A1 Oct. 27, 2022

Related U.S. Application Data

(60) Provisional application No. 63/178,957, filed on Apr. 23, 2021.

(51) Int. Cl.
*H05K 9/00* (2006.01)
*H01Q 1/02* (2006.01)
(Continued)

(52) U.S. Cl.
CPC ......... *H05K 9/0037* (2013.01); *H01Q 1/2291* (2013.01); *H01Q 1/246* (2013.01);
(Continued)

(58) Field of Classification Search
CPC .............................. G06T 5/009; H04N 21/4516
See application file for complete search history.

(56) References Cited

U.S. PATENT DOCUMENTS

2003/0112595 A1* 6/2003 Kwong ................ G11B 33/124
361/728
2014/0327751 A1* 11/2014 King .................. A61B 1/00105
348/75
(Continued)

FOREIGN PATENT DOCUMENTS

| EP | 1 657 779 | 5/2006 |
|---|---|---|
| EP | 3 163 676 | 5/2017 |
| EP | 3 595 421 | 1/2020 |

OTHER PUBLICATIONS

International Search Report and the Written Opinion of the International Searching Authority dated May 25, 2022 in International (PCT) Application No. PCT/US2022/016099.
(Continued)

*Primary Examiner* — Getente A Yimer
(74) *Attorney, Agent, or Firm* — Wenderoth, Lind & Ponack, L.L.P.

(57) ABSTRACT

A robust, reliable, and efficient UHD HDR Internet Protocol IP client device, such as a set top box, receives content, for example, from a cable service provider so that the content can be displayed to a compatible display device with improved visual effect. The content is 4K or higher content that requires UHD/HDR for a satisfactory user experience. The UHD provides for an improved resolution of the content while HDR provides for a more intense or greater contrast range of the content when displayed on a compatible display device.

20 Claims, 15 Drawing Sheets

(51) Int. Cl.

| | | |
|---|---|---|
| *H01Q 1/22* | (2006.01) | |
| *H01Q 1/24* | (2006.01) | |
| *H01Q 1/52* | (2006.01) | |
| *H01Q 21/28* | (2006.01) | |
| *H04N 5/64* | (2006.01) | |
| *H04N 21/426* | (2011.01) | |
| *H04N 21/4363* | (2011.01) | |
| *H04N 21/643* | (2011.01) | |
| *H04N 21/81* | (2011.01) | |

(52) U.S. Cl.
CPC ..... *H04N 21/426* (2013.01); *H04N 21/64322* (2013.01); *H05K 9/0024* (2013.01)

(56) References Cited

U.S. PATENT DOCUMENTS

| | | | |
|---|---|---|---|
| 2016/0174361 A1 | 6/2016 | Chen et al. | |
| 2017/0186141 A1* | 6/2017 | Ha | H04N 9/646 |
| 2018/0176526 A1* | 6/2018 | Sivalingam | H04N 21/4516 |
| 2018/0278926 A1* | 9/2018 | Mendenhall | H04N 17/004 |
| 2020/0252687 A1* | 8/2020 | Ryu | G06T 5/009 |
| 2020/0395661 A1 | 12/2020 | Bai et al. | |

OTHER PUBLICATIONS

International Search Report and the Written Opinion of the International Searching Authority dated May 10, 2022 in International (PCT) Application No. PCT/US2022/016100.

Arris Group: "DSR830 Satellite Set-Top Box Teardown Internal Photos 170222C39_EUT photo_ ARRIS Group", Dec. 3, 2017 (Dec. 3, 2017), pp. 7-16, XP055915859, Retrieved from the Internet: URL:https://fccid.io/ACQ-DSR830/Internal-Photos/Internal-Photos-pdf-3413252.pdf [retrieved on Apr. 26, 2022] p. 7-p. 14.

International Preliminary Report on Patentability and Written Opinion issued Nov. 2, 2023 in International Application No. PCT/US2022/016099.

International Preliminary Report on Patentability and Written Opinion issued Nov. 2, 2023 in International Application No. PCT/US2022/016100.

\* cited by examiner

UHD HDR IP CLIENT DEVICE

BACKGROUND

Users are increasingly expecting to receive content that can be viewed with greater quality and quantity, such as content provided by a cable service provider. Users are expecting to receive content that can be displayed with ultra high definition (UHD) or 4k, high dynamic range (HDR), or both. Thus, there is a need for a device that can receive and process such content.

SUMMARY

According to aspects of the present disclosure there are provided novel solutions for a UHD HDR Internet Protocol (IP) client device, such as a set top box, that can receive content, for example, from a cable service provider so that the content can be displayed to a compatible display device with improved visual effect. For example, UHD provides for an improved resolution while HDR provides for a more intense or greater contrast range. Throughout this disclosure the UHD HDR IP client device may also be referred to as a UHD HDR wireless fidelity (Wi-Fi) client device. The UHD HDR IP client device provides for tuning and decoding of content, for example, the UHD HDR IP client device can comprise a high definition video decoder that provides for any one or more of HDR (such as HDR 10), advanced HDR (Dolby Vision), HEVC 10-bit 4Kp60, MPEG-4 AVC HP@L3/L4 up to 1080p60, MPEG-2 MP @ML/HL up to 1080p60, and VP9.2 AV1, Motion JPEG, an audio decoder that provides for any one or more of MPEG-1 Layers 2 & 3 (MP3), AAC, HE=AAC, HE-AAC v2, Dolby AC-4, Dolby Digital (AC-3) Dolby Digital Plus (E-AC 3), Dolby Digital Plus with Atmos, Dolby Multistream MS12, L-PCM, and SBC, and/or a still image decoder such as JPEG, GIF, and/or PNG. The UHD HDR IP client device can include one or more interfaces such as a WPS for Wi-Fi pairing (for example, on a bottom portion or panel) and any of a high definition multimedia interface (HDMI) Output 2.1, 10/100 Ethernet, and/or Power Barrel (for example, on a rear portion or panel). The UHD HDR IP client device can included one or more elements to provide connectivity such as Wi-Fi, Dual Band, 2×2 802.11ax, Bluetooth 5.0, IR, ZigBee RF4CE, any other connectivity and/or protocol, or any combination thereof. In one or more embodiments, the UHD HDR IP client device includes an ARM processor (for example, 15500DMIPS), a flash and TSB (for example, 16 GB eMMC+), and/or a random access memory (RAM) (for example, 2 gigabytes RAM).

Thus, according to various aspects of the present disclosure described herein, it is possible to provide an improved user experience using a UHD HDR IP client device as discussed herein.

BRIEF DESCRIPTION OF DRAWINGS

In the drawings, like reference numbers generally indicate identical, functionally similar, and/or structurally similar elements.

DETAILED DESCRIPTION

The following detailed description is made with reference to the accompanying drawings and is provided to assist in a comprehensive understanding of various example embodiments of the present disclosure. The following description includes various details to assist in that understanding, but these are to be regarded merely as examples and not for the purpose of limiting the present disclosure as defined by the appended claims and their equivalents. The words and phrases used in the following description are merely used to enable a clear and consistent understanding of the present disclosure. In addition, descriptions of well-known structures, functions, and configurations may have been omitted for clarity and conciseness. Those of ordinary skill in the art will recognize that various changes and modifications of the examples described herein can be made without departing from the spirit and scope of the present disclosure.

Figure 1:
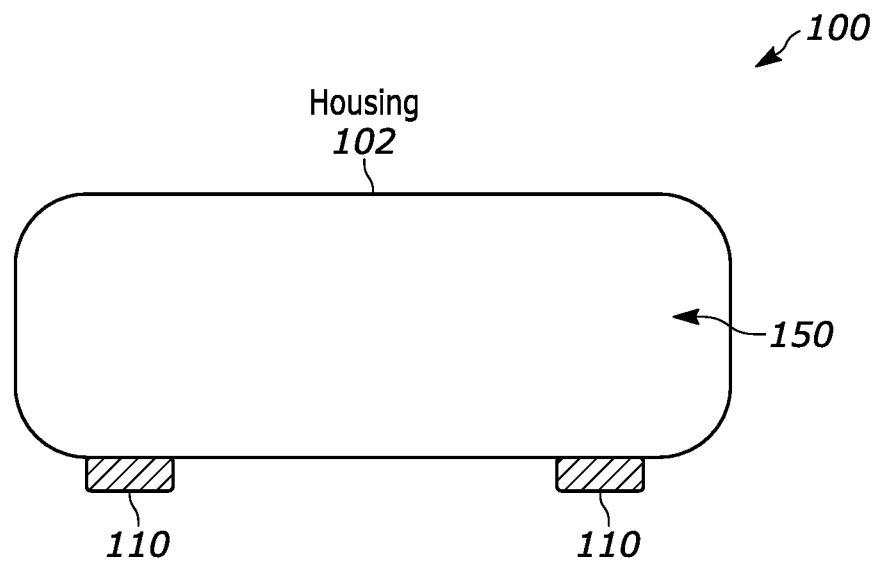
FIG. 1 is a side angle view of a UHD HDR IP client device as an exemplary form factor, according to one or more aspects of the present disclosure.

FIG. 1 is a side angle view 100 of a UHD HDR IP client device 150 as an exemplary form factor, according to one or more aspects of the present disclosure. The UHD HDR IP client device 100 includes an outer housing 102. The outer housing 102, for example, can have a width of 4.26 inches/ 108.3 millimeters, a depth of 4.2 inches/106/6 millimeters, and a height of 0.82 inches, 20.8 millimeters, or any other width, depth and/or height so as to provide protection for one or more elements of the UHD HDR IP client device 150. In one or more embodiments, the UHD HDR IP client device 150 comprises one or more pads 110 disposed about the housing 102 so as to provide support, stability, reduction in movement, or any combination thereof of the UHD HDR IP client device 150.

Figure 2:
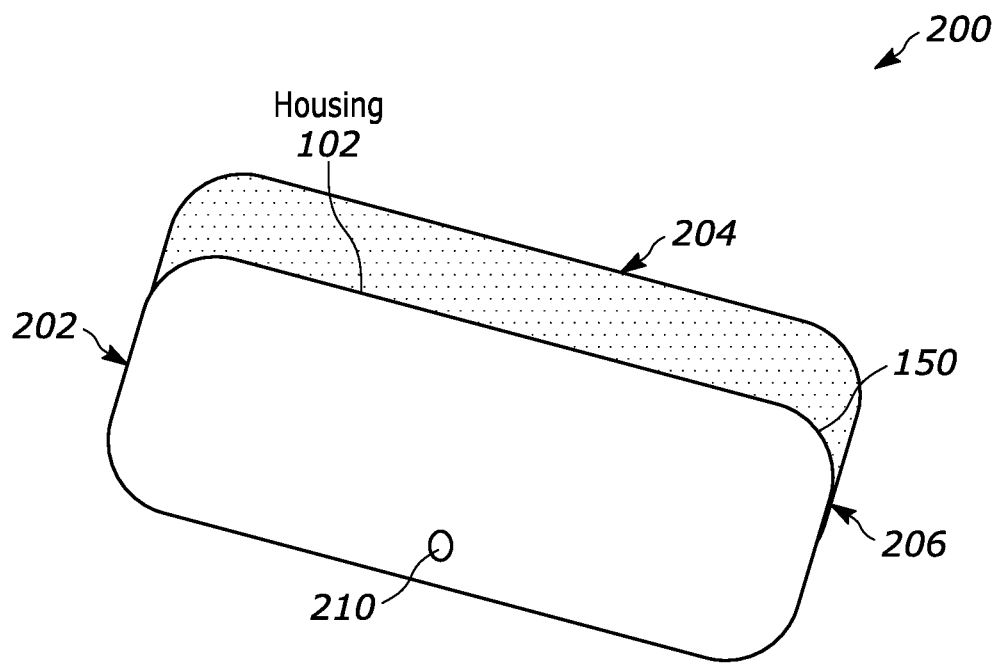
FIG. 2 is a top view of a UHD HDR IP client device as an exemplary form factor, according to one or more aspects of the present disclosure.

FIG. 2 is a top view 200 of n UHD HDR IP client device 150 as an exemplary form factor, according to one or more aspects of the present disclosure. In one or more embodiments, a front portion 202 has a height that is less than a height of a back portion 204 such that a side portion 206 slopes at an angle from the back portion 204 to the front portion 202. In one or more embodiments, the UHD HDR IP client device 150 comprises an indicator 210, for example, an indicator that provides a visual indicator as to the operability or the functionality of the UHD HDR IP client device 150. For example, the indicator 210 can be a light emitting diode (LED) that comprises any of power indicator, connectivity indicator, or any other indicator, or a combination thereof.

Figure 3:
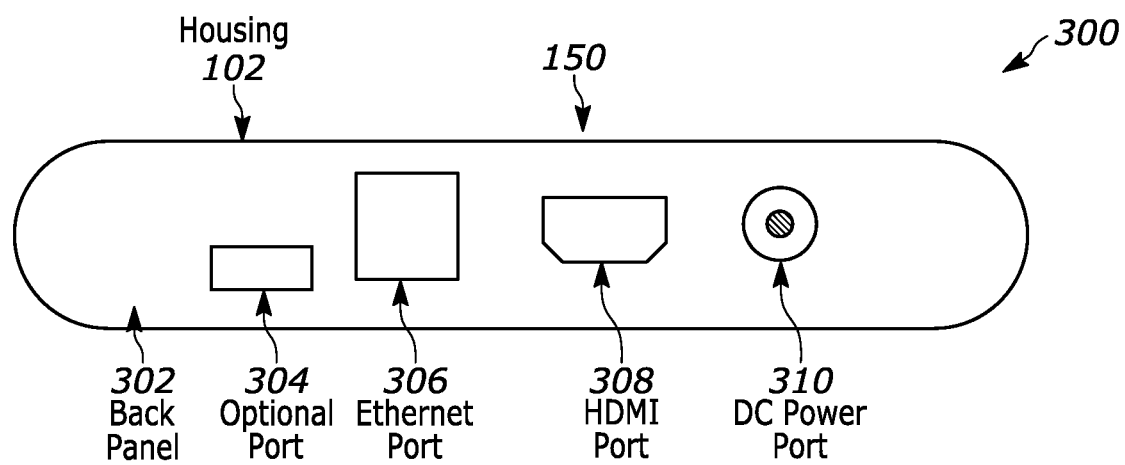
FIG. 3 is a back view of a UHD HDR IP client device form factor, according to one or more aspects of the present disclosure.

FIG. 3 is a back view 300 of a UHD HDR IP client device 150 form factor, according to one or more aspects of the present disclosure. A back panel 302 of the UHD HDR IP client device 150 can comprise an option port 304, an Ethernet port 306, HDMI port 308, a direct current (DC) power port 310, or any combination thereof. In one or more embodiments, any one or more of the elements 304-310 can be disposed or located at any side or surface of the UHD HDR IP client device 150. In one or more embodiments, the UHD HDR IP client device 150 can comprise any number of any of the elements 304-310.

Figure 4:
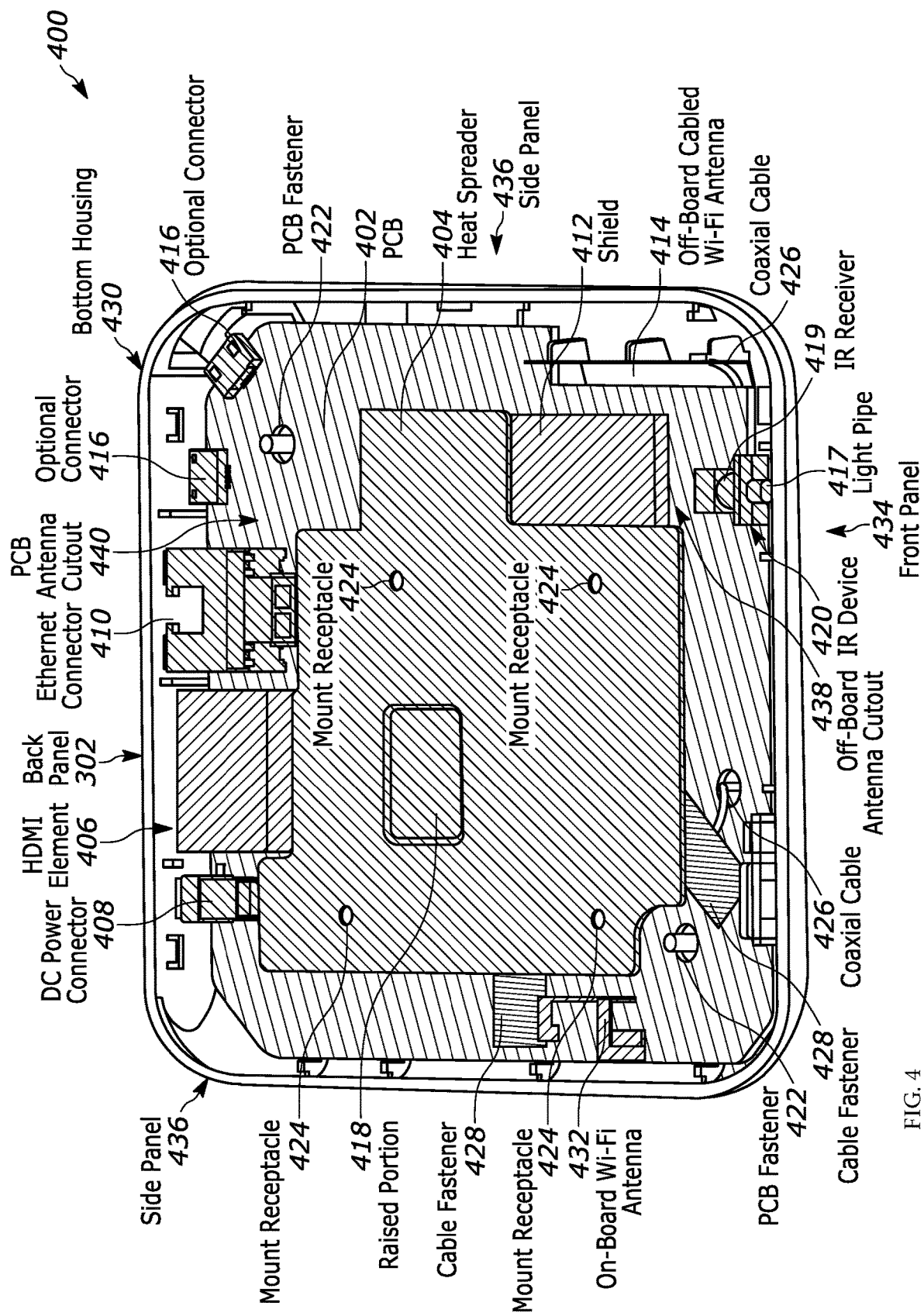
FIG. 4 is a block diagram of a top view of a UHD HDR IP client device, according to one or more aspects of the present disclosure.
Figure 9:
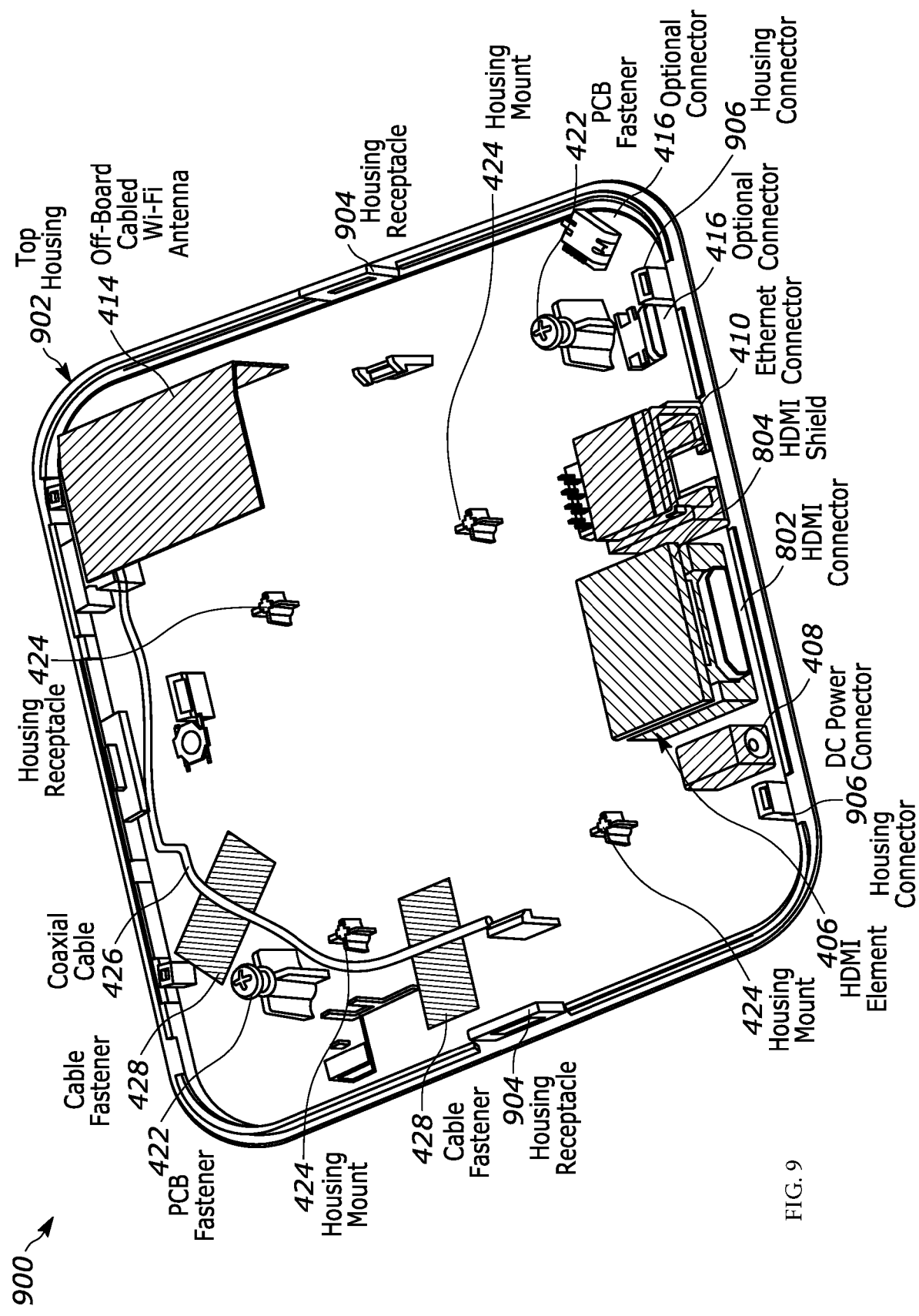
FIG. 9 is a block diagram of an internal top housing view of a UHD HDR IP client device, according to one or more aspects of the present disclosure.

FIG. 4 is a block diagram of a top view 400 of a UHD HDR IP client device 150, according to one or more aspects of the present disclosure. The UHD HDR IP client device 150 comprises a bottom housing 430 of the housing 102. The bottom housing 430 is disposed opposite a top housing, such as top housing 902, of the housing 102. A printed circuit board (PCB) 402 is secured or otherwise disposed about the bottom housing 430 between a first side panel 436 and a second side panel 436 disposed opposite the first side panel 436. In one or more embodiments the PCB 402 comprises six layers for the disposition of one or more components and routing of one or more connectors between the one or more components. One or more PCB fasteners 422 secure the PCB board 402 to the top housing (top housing 902 as illustrated in FIG. 9, for example). The one or more PCB fasteners 422 can comprise a screw, a bolt, a dowel rod or pin, a clip, any other permanent or non-permanent device for affixing the PCB 402 to the housing 102, or any combination thereof.

A shield 412 is partially disposed about the PCB 402 such that provides protection to the one or more components of the PCB 402, such as a processor or central processing unit (CPU), a memory, any other component necessary for the functioning of the UHD HDR IP client device 150, or any combination thereof. In one or more embodiments, the shield 412 is a bent stamped metal with a thickness that is soldered to the PCB 402. The thickness of the shield 412 depends on the one or more components of the PCB 402. The shield 412 prevents, dampens, or reduces of emissions due to a high frequency memory interface between the system on chip and a memory (such as double data rate (DDR) memory or any other memory). For example, the Federal Communications Commissions (FCC) sets limits on the amount of high frequency noise or electromagnetic interference (EMI) emissions that radiate from a device. The shield 412 prevents, dampens, reduces or otherwise limits the radiated emissions from the UHD HDR IP client device 150. The shield 412 can also prevent, dampen, reduce, or otherwise limit interference with any Wi-Fi component of the PCB 402.

The heat spreader 404 is disposed partially about the shield 412 such that the heat spreader 404 is in contact with the shield 412. In one or more embodiments, the heat spreader 404 is removably disposed about the shield 412. The heat spreader 404 acts as a thermal spreader to diffuse an thermal output from one or more components of the PCB 402. The heat spreader 404 can comprise a die cast metal. In one or more embodiments, the heat spreader 404 is thicker than the shield 412. One or more mount receptacles 424 can be disposed about the heat spreader 404 to allow the heat spreader 404 to be secured or otherwise fastened to the housing 102 (for example, a top housing 902 of FIG. 3). The one or more receptacles 424 can be through-hole apertures or partial hole apertures. The heat spreader 404 comprises a raised portion 418, for example, an inverted dimple, an indentation, a protuberance, a protrusion, any other beveled and/or round raised portion, or any combination thereof. In one or more embodiments, the raised portion 418 is a stamped rounded beveled edge rectangular protuberance as illustrated in FIG. 4. The raised portion 418 applies a pressure to a thermal material (for example, thermal pad 1002 of FIG. 10) disposed between the heat spreader 404 and a high thermal emitting component of the PCB 402 (such as an SOC) so as to keep or maintain the positioning of the thermal pad. The heat spreader 404 can also comprise an off-board antenna cutout 438 and a PCB antenna cutout 440. The off-board antenna cutout 438 is such that a portion of the shield 412 is exposed or not covered by the heat spreader 404. The off-board antenna cutout 438 eliminates or reduces interference between the heat spreader and one or more antennas disposed about the PCB 402 (not shown) or otherwise disposed within the housing 102, such as off-board cabled Wi-Fi antenna 414. The off-board antenna cutout 438 can eliminate or reduce the negative impact (such as electrical interference) of having a metal within close proximity to an antenna. Similarly, the PCB antenna cutout 440 eliminates or reduces interference with a PCB trace antenna printed on the PCB 402.

Within the housing 102 are a plurality of antennas. For example, two Wi-Fi antennas (such as off-board cabled Wi-Fi antenna 414 and on-board Wi-Fi antenna 432), a Bluetooth (BT) antenna, and a Zigbee RF4CE antenna for interfacing with a remote control device. The plurality of antennas are disposed about the UHD HDR IP client device 150 based on one or more factors, such as any of radio frequency (RF) antenna performance (such as radiation patterns, efficiency, isolation, etc.), self-noise of the PCB 402 or noise sources (such as HDMI, Ethernet, DDR, universal serial bus (USB), any other high speed signal that has a harmonic that falls into the Wi-Fi band, etc.). For example, the integrated circuit has an impedance so will need to match to the source impedance so as to avoid an impedance mismatch that can affect signal integrity, such as harmonic issues that can arise with a signal associated with any given antenna due to an impedance mismatch. The disposition of the plurality of antennas as shown minimizes the impedance mismatch resulting in minimal or no noise radiation from an impedance mismatch point. The Bluetooth antenna and the Zigbee RF4CE antenna can each comprise a PCB trace antenna disposed on the PCB 402 (not shown).

The off-board cabled Wi-Fi antenna 414 and the on-board Wi-Fi antenna 432 are disposed towards front panel 434 of the housing 102. Each of these Wi-Fi antennas can support 2×2 Wi-Fi 6 dual-band such that each comprises two transmitting and two receiving antennas for supporting at least two of a 2.4 Gigahertz (GHz) band, a 5 GHz band, or any other band. The off-board cabled Wi-Fi antenna 414 is partially disposed between the PCB 402 and the bottom housing 430 and curves upward to extend toward a top of the housing 102 (for example, a top housing 902. The off-board cabled Wi-Fi antenna 414 is disposed on one side of the bottom housing 430 opposite from an on-board Wi-Fi antenna 432 disposed on the PCB 402. The off-board cabled Wi-Fi antenna 414 is secured to the bottom housing 430, for example, using an adhesive or bonding agent (such as glue, tape, resin, paste, any other material that bonds two materials together, or any combination thereof). The positioning of the on-board Wi-Fi antenna and the off-board cabled Wi-Fi antenna 414 across from each other reduces or eliminates interference with any antenna within the housing 102 and/or any other noise associated with any antenna, one or more components of the PCB 402, or both. The on-board Wi-Fi antenna 432 can comprise a stamped metal that is reliably placed (such as soldered) to the PCB 402. The on-board Wi-Fi antenna 432 generally is lower in cost, easier to manufacturer, and more reliability in placement as compared to the off-board cabled Wi-Fi antenna 414. The off-board cabled Wi-Fi antenna 414 is fed by a coaxial cable 426 that is threaded across the PCB 402 to the on-board Wi-Fi antenna 432, for example, across a side of the PCB 402 opposite of the on-board Wi-Fi antenna 432 and then threaded through an aperture to the same side of the PCB 402 as the on-board Wi-Fi antenna 432. Generally, the coaxial cable 426 is manually routed during manufacturing. The connection via the coaxial cable 426 allows the off-board cabled Wi-Fi antenna 414 and the on-board Wi-Fi antenna 432 to be disposed as far apart as possible from each other, for example, to minimize interference with each other, maximize antenna radiation patterns, and isolate the antennas from one or more other components. In one or more embodiments, one or more cable fasteners 428 can be used to secure or maintain the coaxial cable 426 or any other cable in a stationary position.

An infrared (IR) device 420 is disposed on the PCB 402, for example, at a front panel 434). The IR device 420 can comprise a light pipe 417 and an IR receiver 419. For example, the light pipe 417 can be disposed at least partially within the front panel 434 and coupled to the PCB 402 such that one or more signals received via the light pipe 417 at the IR receiver 419 can be transmitted to a SOC of the PCB 402. The light pipe 417 can comprise a plastic material that allows, directs or otherwise funnels light coming from an IR signal outside the UHD HDR IP client device 150, such as from a remote control, to the diode 419. In one or more embodiments, the IR receiver 419 comprises a diode.

As discussed with reference to FIG. 3, one or more ports may be disposed about the back panel 302. The one or more ports can align with a DC power connector 408, an HDMI element 406, an Ethernet connector 410, and one or more optional connectors 416. The one or more optional connectors 416 can comprise a USB connector that allows for testing or software updating during manufacturing or design. In one or more embodiments, the one or more optional connectors 416 are not included during production or manufacturing of a distributable UHD DHR IP client device 150. The HDMI element 406 allows the UHD DHR IP client device 150 to receive 4k or higher video, for example, from a cable service provider. The Ethernet connector 410 provides for access to a network resource. The DC power connector 408 allows for DC power to be received for powering the one or more components of the UHD DHR IP client device 150.

Figure 5:
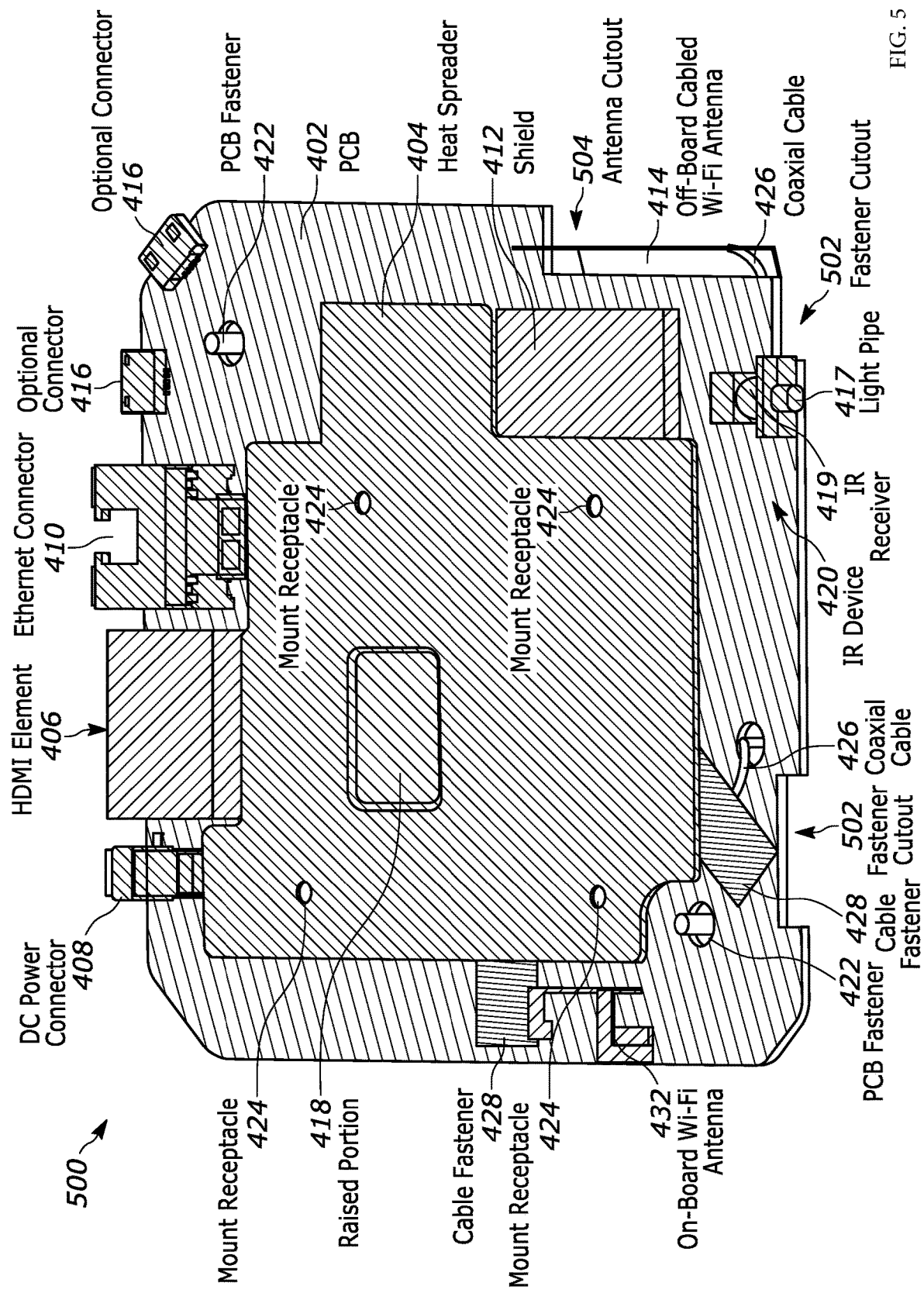
FIG. 5 is a block diagram of a top view of a UHD HDR IP client device, according to one or more aspects of the present disclosure.

FIG. 5 is a block diagram of a top view 500 of a UHD HDR IP client device 150 without a housing 102, according to one or more aspects of the present disclosure. The UHD HDR IP client device 150, as discussed herein, can also include one or more fastener cutouts 502. The one or more fastener cutouts 502 allow the PCB board 402 to mount in the housing 102 without interfering with any fasteners required for connecting a bottom housing 430 with a top housing 902. The UHD HDR IP client device 150 can also comprise an antenna cutout 504 that allows the off-board cabled Wi-Fi antenna 414 to curve from one side of the PCB 402 to the other.

Figure 6:
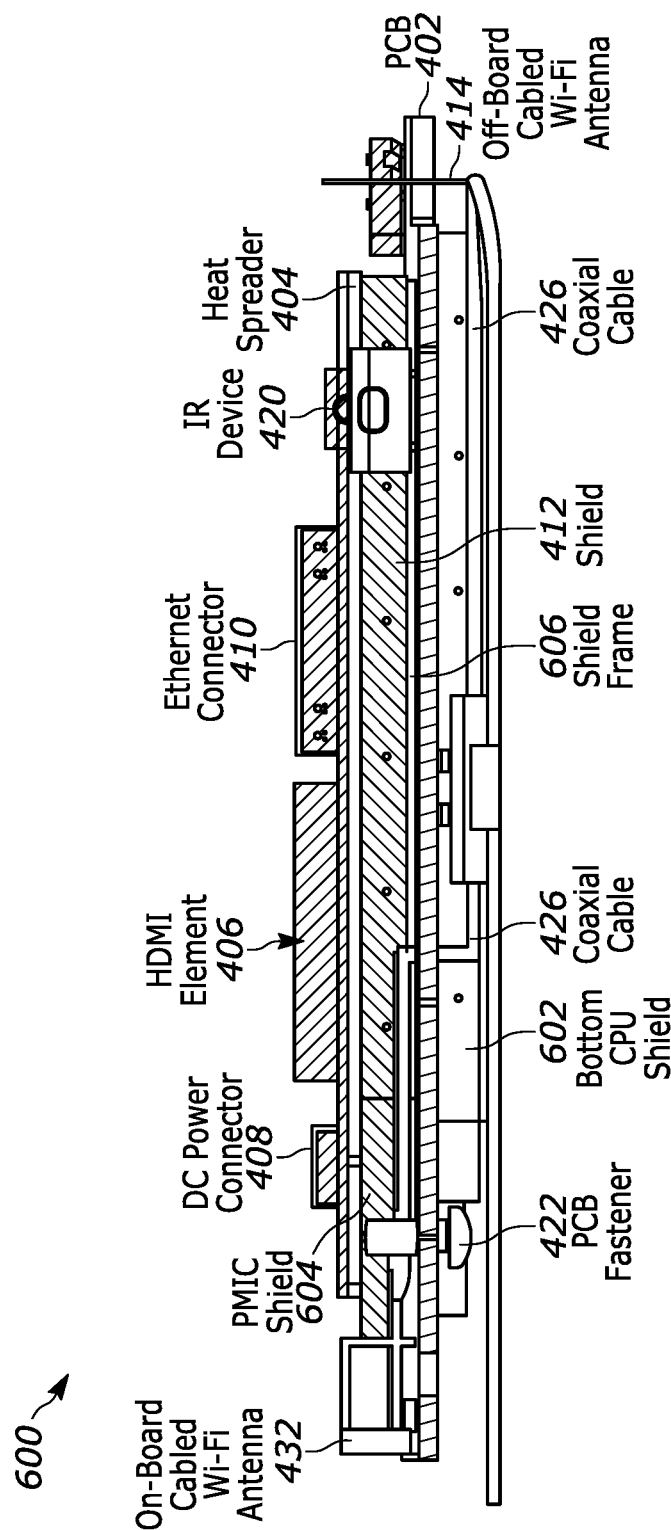
FIG. 6 is a block diagram of a front facing cross-section view of n UHD HDR IP client device, according to one or more aspects of the present disclosure.

FIG. 6 is a block diagram of a front facing cross-section view 600 of a UHD HDR IP client device 150, according to one or more aspects of the present disclosure. The UHD HDR IP client device 150, as discussed herein, can include a power management integrated circuit (PMIC) shield 604 to isolate a PMIC disposed on the PCB 402. The UHD HDR IP client device 150 can also include a shield frame 606 to provide rigidity to the shield 412. The UHD HDR IP client device 150 can also include a bottom CPU shield 602 that shields a processor or CPU disposed on the PCB 402. FIG. 6 shows how to shield noise sources while still maintaining the thermal performance required for proper operation of the UHD HDR IP client device 150. In one or more embodiments, the PMIC shield 604 and the shield frame 606 form a single shield. In one or more embodiments, the PMIC shield 604 and the shield frame 606 of a single shield can be separated by an interior wall or divider. The PMIC shield 604 and the shield frame 606 are formed so as to have no gaps or openings so as to prevent noise from within and/or outside of each interfering with one or more other signals or components.

Figure 7:
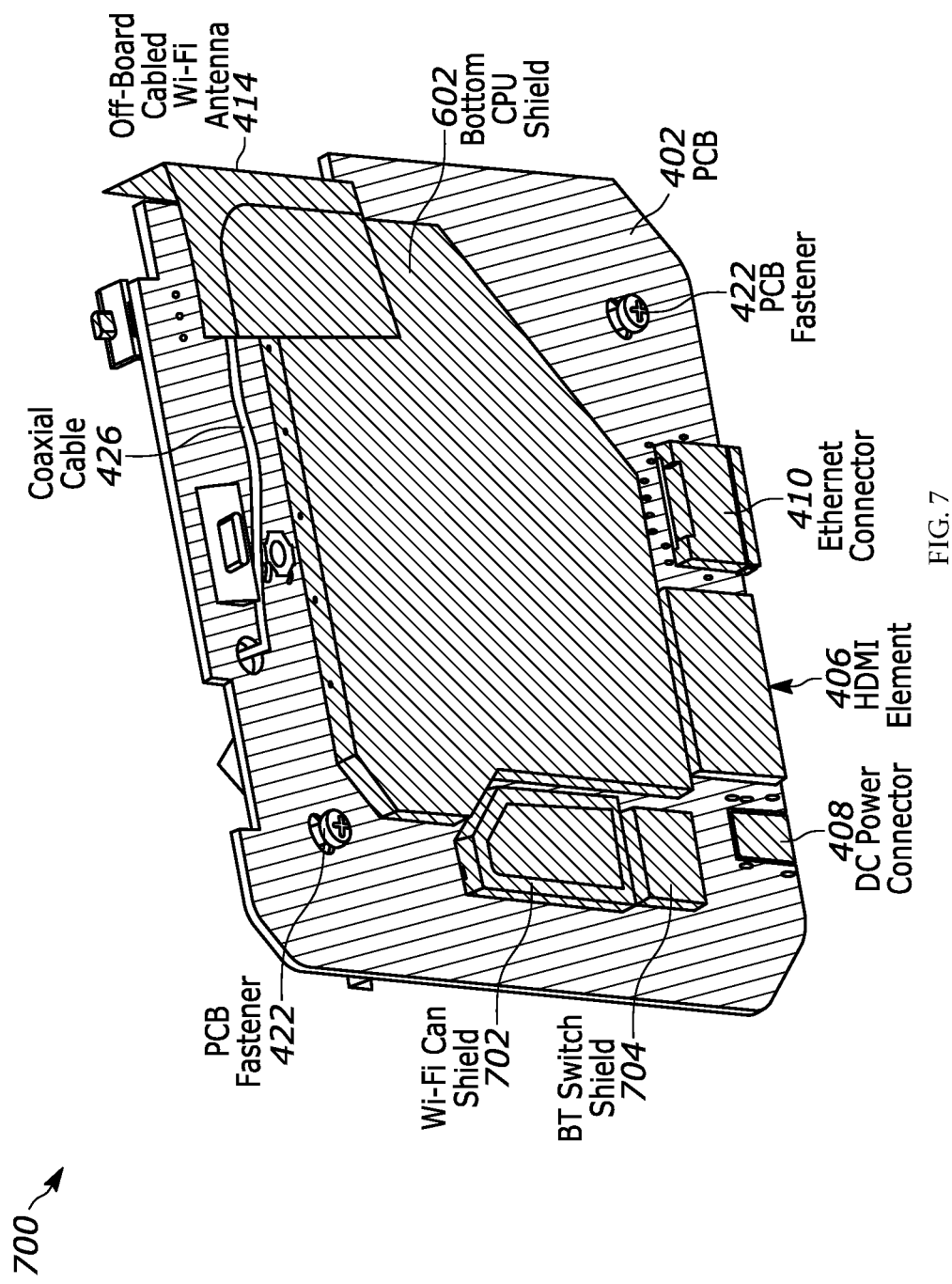
FIG. 7 is a block diagram of a bottom side view angled down from front of a UHD HDR IP client device, according to one or more aspects of the present disclosure.

FIG. 7 is a block diagram of a bottom side view 700 angled down from a front of a UHD HDR IP client device 150, according to one or more aspects of the present disclosure. As illustrated, the off-board cabled Wi-Fi antenna 414 can wrap or bend around the PCB 402 such that at least a portion of the off-board cabled Wi-Fi antenna 414 is disposed on the bottom housing 430 while a side portion of the off-board cabled Wi-Fi antenna 414 extends upwards and to the side of the PCB 402. A Wi-Fi can shield 702 is disposed about one or more Wi-Fi components to provide a shield against interference and/or to prevent any interference. A BT switch shield 704 is disposed about one or more BT components to provide a shield against interference and/or to prevent any interference. The Wi-Fi can shield 702 and/or the BT switch shield 704 are configured such that no gaps exist at any of the one or more corners of the Wi-Fi can shield 702 and/or the BT switch shield 704 so as to minimize any interference with and/or noise from any one or more Wi-Fi components enclosed by the Wi-Fi can shield 702. In one or more embodiments, the Wi-Fi can shield 702 and/or the BT switch shield 704 are a one piece design or a single unit such that a frame is not needed and/or implemented. For example, bottom CPU shield 602 is to keep noise from getting inside whereas the Wi-Fi can shield 702 and the BT switch shield 704 are to keep noise from getting outside the can/shield, The cans/shields discussed herein also prevent Wi-Fi signals, Bluetooth signals or both from interfering with one or more other signals or elements.

Figure 8:
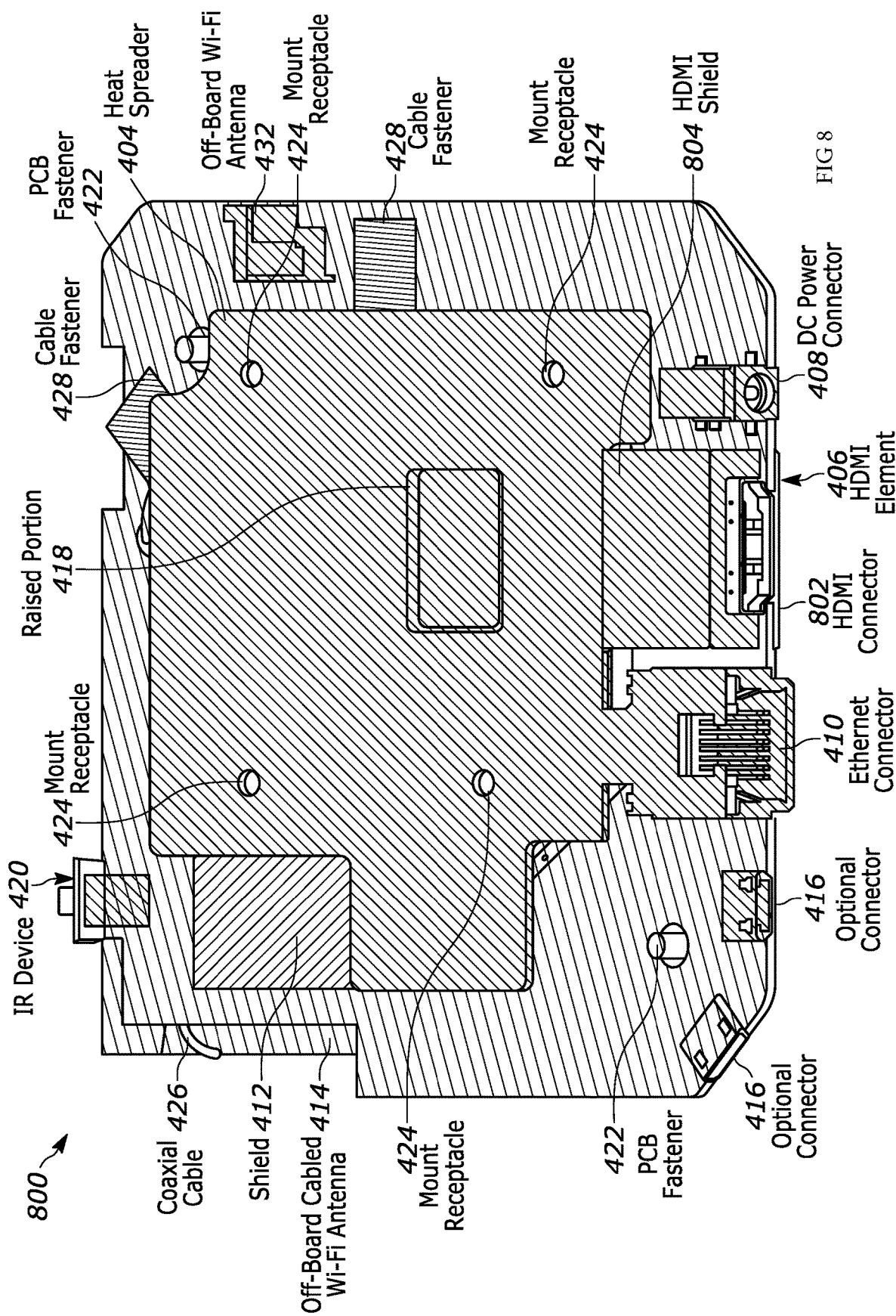
FIG. 8 is a block diagram of a top side view from rear view of a UHD HDR IP client device, according to one or more aspects of the present disclosure.

FIG. 8 is a block diagram of a top side view 800 from rear view of a UHD HDR IP client device 150, according to one or more aspects of the present disclosure. The HDMI element 406 discussed with reference to FIG. 4 can include an HDMI connector 802 and an HDMI shield 804. The HDMI shield 804 isolates or minimizes any interference from one or more components of the UHD HDR IP client device 150 with the incoming signal at the HDMI connector 802.

FIG. 9 is a block diagram of an internal top housing view 900 of a UHD HDR IP client device 150, according to one or more aspects of the present disclosure. View 900 shows the PCB 402 removed. The top housing 902 can have one or more housing receptacles 904 disposed about an interior of the top housing 902 so as to secure the top housing 902 to the bottom housing 430, for example, by mating with a housing connector 1304 of FIG. 13. In one or more embodiments, the one or more housing receptacles 904 comprise an aperture that mates with a protrusion of the housing connector 1304. The top housing 902 can also have on or more housing connectors 906 disposed about an interior edge so as to mate with a housing receptacle 1302 of FIG. 13.

Figure 10:
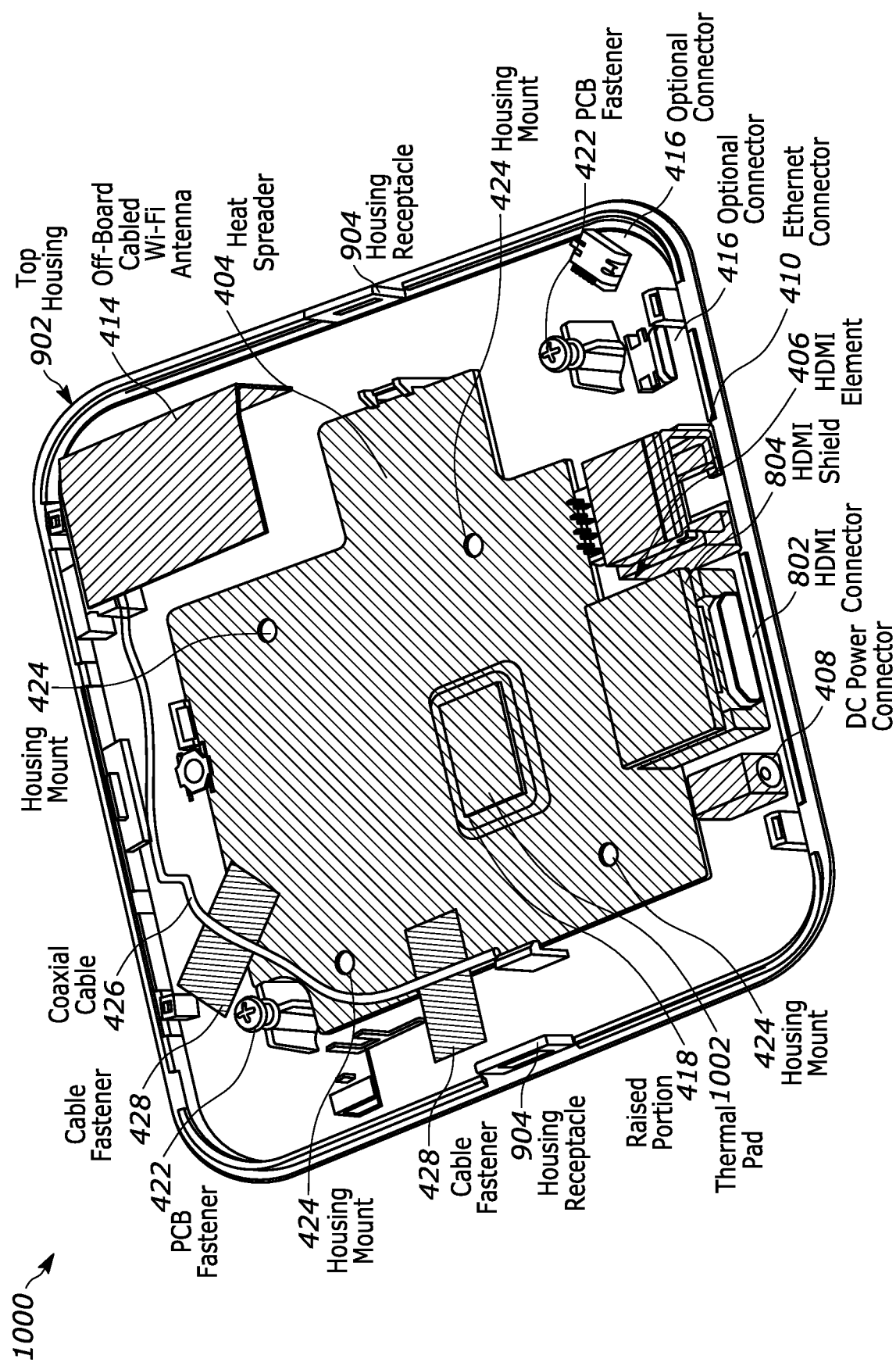
FIG. 10 is a block diagram of an internal top housing view of a UHD HDR IP client device, according to one or more aspects of the present disclosure.

FIG. 10 is a block diagram of an internal top housing view 1000 of a UHD HDR IP client device 150, according to one or more aspects of the present disclosure. The UHD HDR IP client device 150, as discussed herein, can include a thermal pad 1002 disposed about the raised portion 418 of the heat spreader 404.

Figure 11:
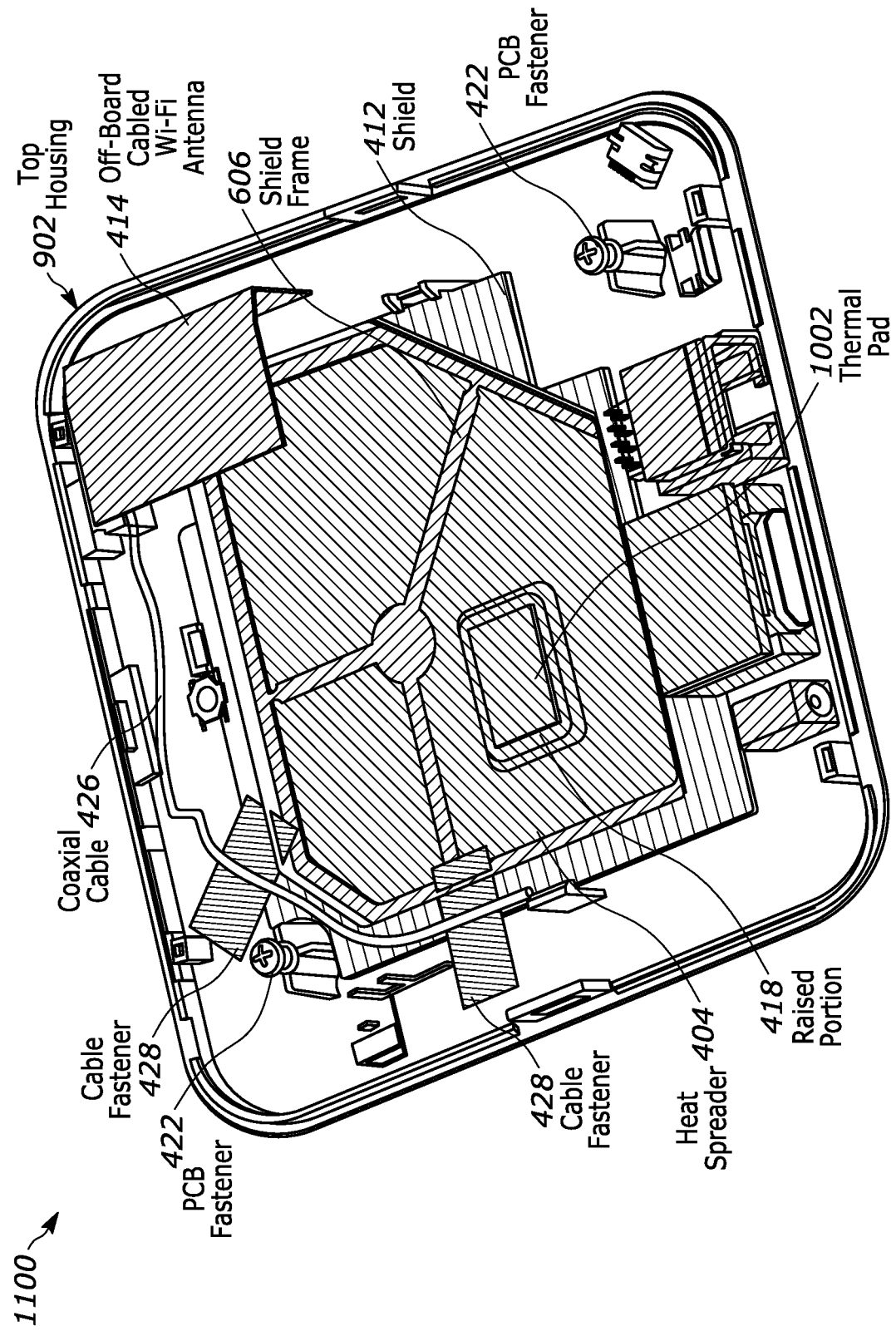
FIG. 11 is a block diagram of an internal top housing view of a UHD HDR IP client device, according to one or more aspects of the present disclosure.

FIG. 11 is a block diagram of an internal top housing view 1100 of a UHD HDR IP client device 150, according to one or more aspects of the present disclosure. The view 1100 illustrates a positioning of the shield frame 606 about the heat spreader 404.

Figure 12:
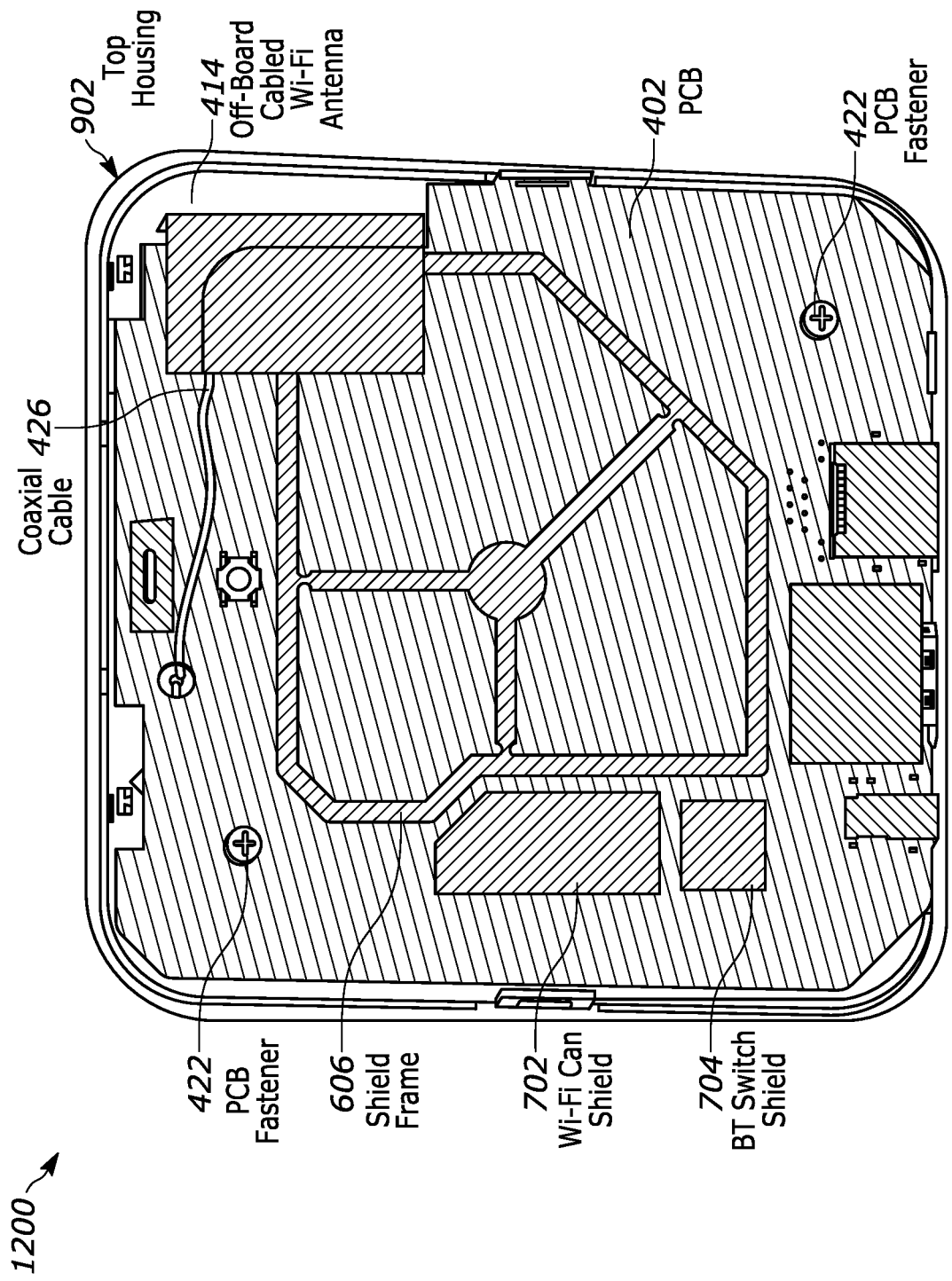
FIG. 12 is a block diagram of an internal top housing view showing a printed circuit board bottom side with the bottom central processing unit (CPU) shield removed of a UHD HDR IP client device, according to one or more aspects of the present disclosure.

FIG. 12 is a block diagram of an internal top housing view 1200 showing a printed circuit board bottom side with the bottom CPU shield 602 removed of a UHD HDR IP client device 150, according to one or more aspects of the present disclosure.

Figure 13:
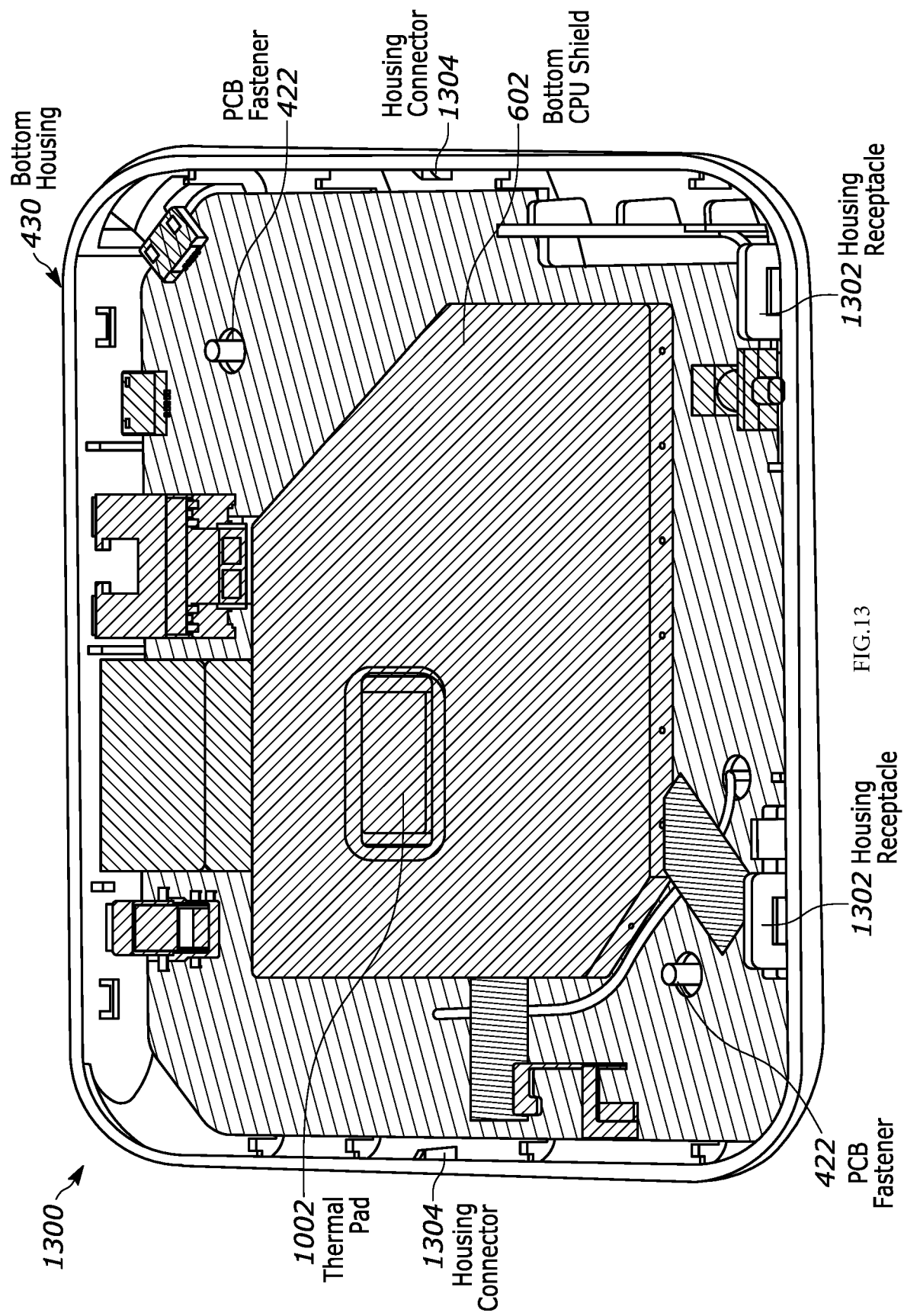
FIG. 13 is a block diagram of an internal bottom housing view with a heat spreader removed of a UHD HDR IP client device, according to one or more aspects of the present disclosure.

FIG. 13 is a block diagram of an internal bottom housing view 1300 with a heat spreader 404 removed of a UHD HDR IP client device 150, according to one or more aspects of the present disclosure. The bottom housing 430 comprises a clip 1302 to secure the bottom housing 430 to the top housing 902. One or more housing connectors 1304 are disposed on an interior edge of the bottom housing 430 to mate with one or more corresponding housing receptacles 904. One or more housing receptacles 1302 are disposed on an interior edge of the bottom housing 430 to mate with one or more corresponding housing connectors 906.

Figure 14:
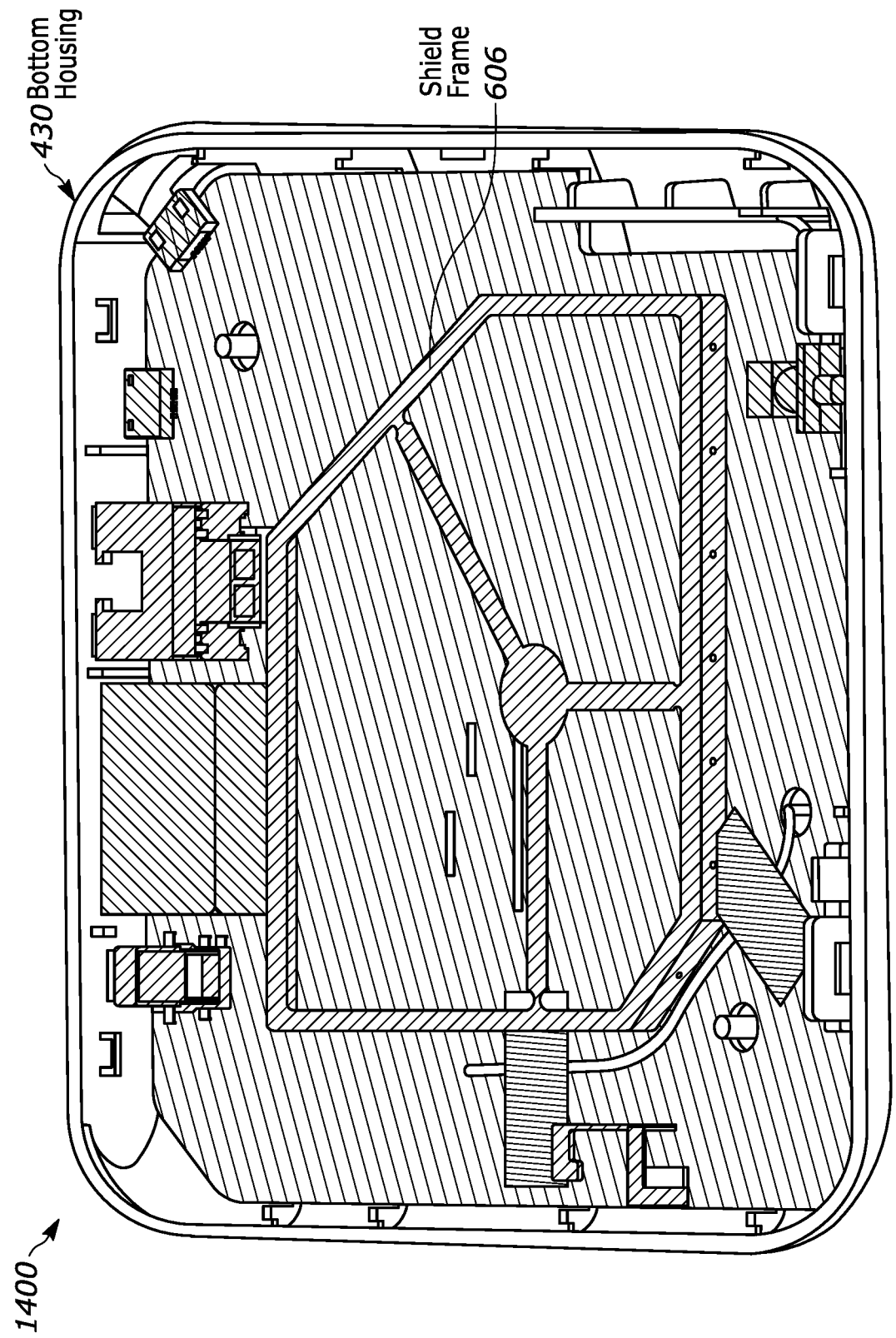
FIG. 14 is a block diagram of an internal bottom housing view with the bottom CPU shield removed of a UHD HDR IP client device, according to one or more aspects of the present disclosure.

FIG. 14 is a block diagram of an internal bottom housing view 1400 with the bottom CPU shield removed 602 of a UHD HDR IP client device 150, according to one or more aspects of the present disclosure.

Figure 15:
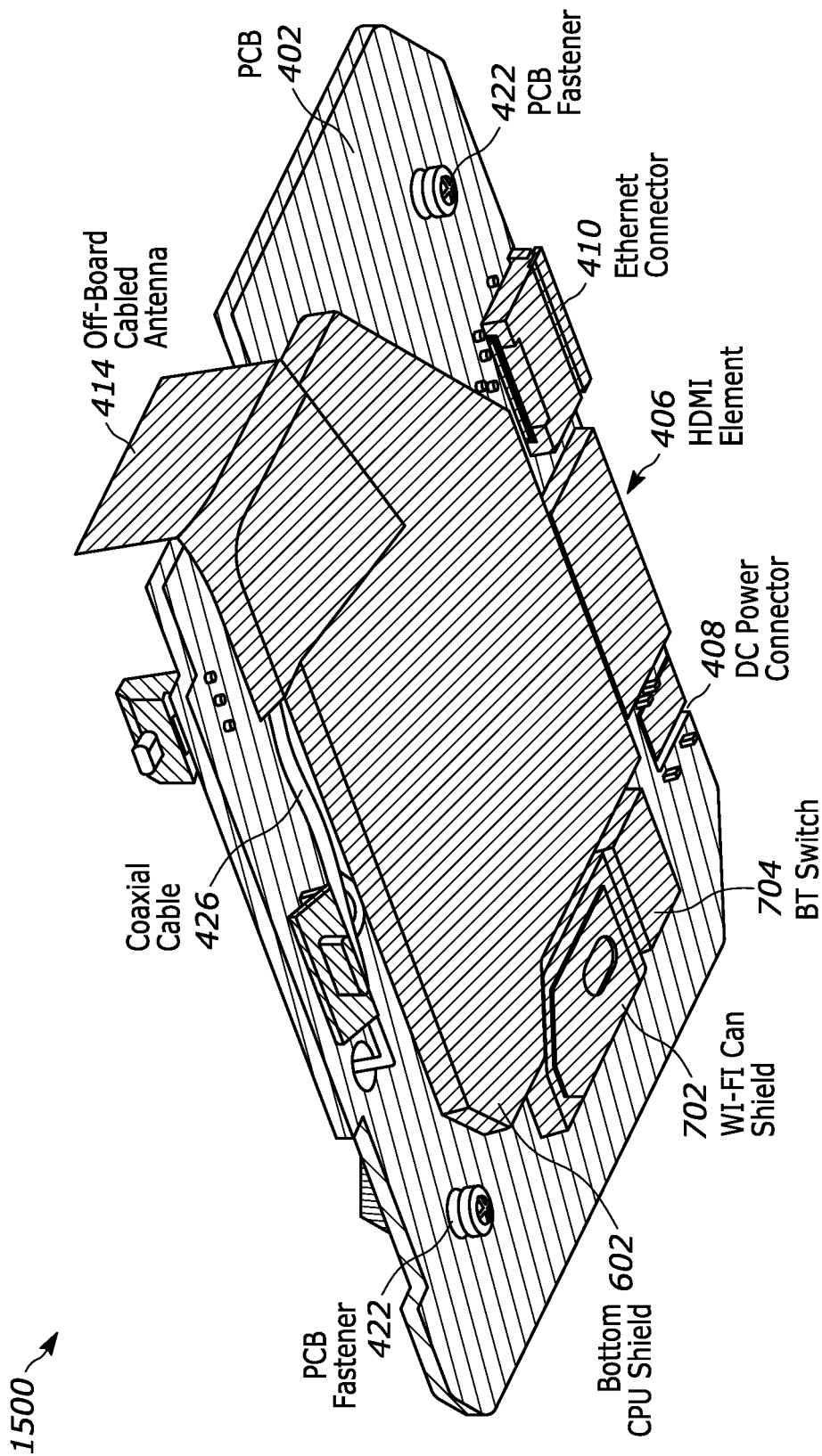
FIG. 15 is a block diagram of a UHD HDR IP client device without a housing, according to one or more aspects of the present disclosure.

FIG. 15 is a block diagram of a view 1500 of a UHD HDR IP client device 150 without a housing 102, according to one or more aspects of the present disclosure.

Figure 16:
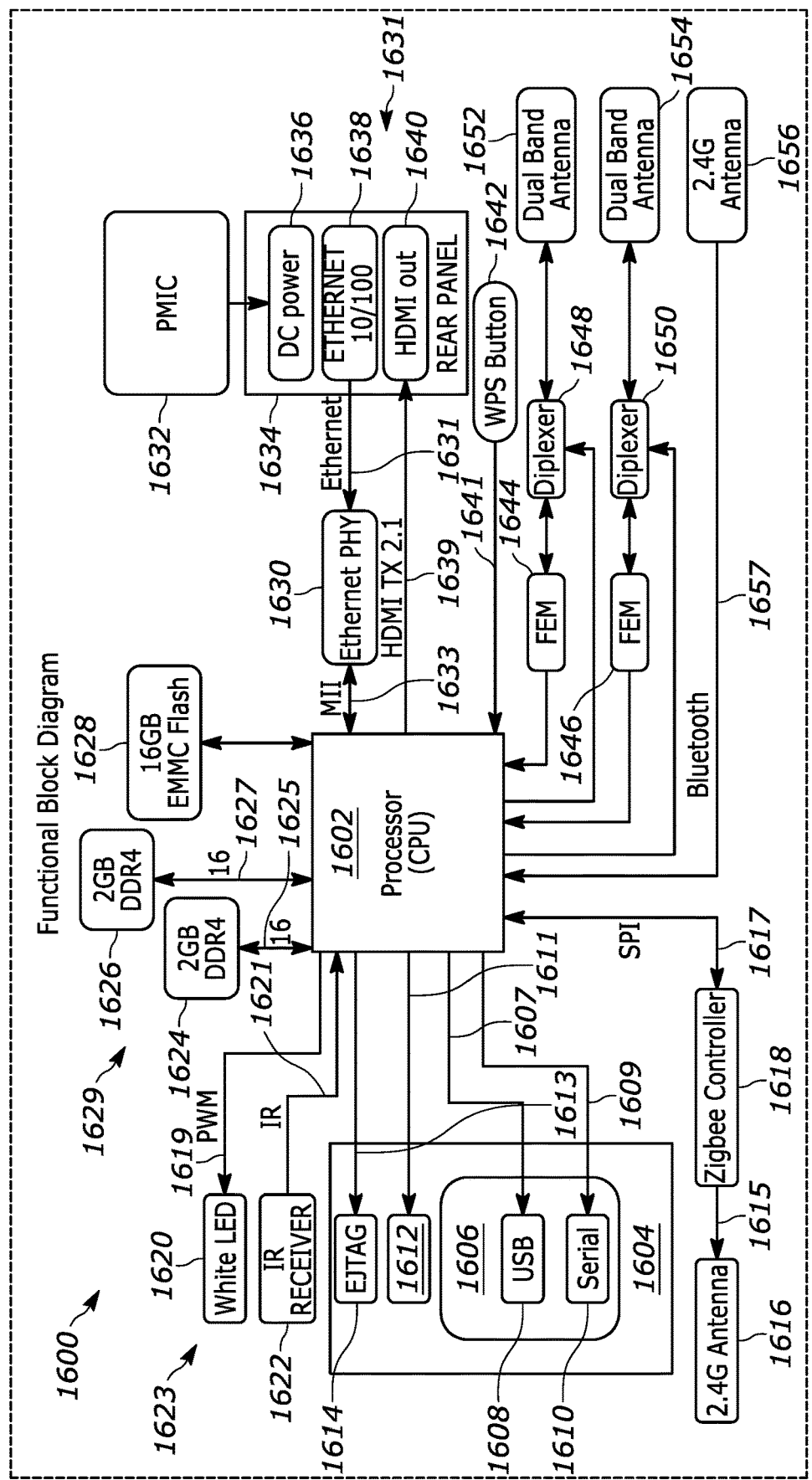
FIG. 16 is a functional block diagram of one or more components of a UHD HDR IP client device, according to one or more aspects of the present disclosure.

FIG. 16 is a is a functional block diagram 1600 of one or more components of a UHD HDR IP client device, according to one or more aspects of the present disclosure. A processor (or CPU) 1602 is coupled to a plurality of components to provide the processing necessary for receiving 4K content and transmitting the 4k content to a display device coupled to the UDH HDR IP client device, for example, via a HDMI out 1640. The processor 1602 can couple to a debug interface 1604. The debug interface 1604 can comprise one or more interfaces, for example, an eJTAG interface 1614, a debug access port 1612, a development module 1606, any other interface, or any combination thereof. The eJTAG interface 1614 couples to the processor 1602 via a connection 1613. The debug access port 1612 can couple to the processor 1602 via a connection 1611. The development module 1606 comprises a USB interface 1608 and a serial interface 1610. The USB interface 1608 can couple to the processor 1602 via a connection 1607 and the serial interface 1610 can couple to the processor via a connection 1609. The debug interface 1604 provides for development, testing, or analysis of one or more components of the functional block diagram 1600.

The processor 1602 can also couple to an infrared (IR) device 1623. The IR device 1623 can comprise a light emitting diode (LED) 1620 (for example, a white LED and an IR receiver 1622. The processor 1602 can receive an IR signal 1621 from the IR receiver 1622 and transmit a pulse width modulated (PWM) signal 1619 to the LED 1620.

The processor 1602 can couple to one or more memories. For example, the one or more memories can comprise a first double data rate (DDR)4 memory 1624, a second DDR4 memory 1626, an embedded multimedia card (eMMC) flash memory 1628, any other memory or any combination thereof. The processor 1602 can store and/or retrieve data from the first DDR memory 1624 via a connection 1625 (for example, a 16-bit data connection 1625) and the second DDR memory 1626 via a connection 1627 (for example, a 16-bit data connection 1627). The first DDR memory 1624 and the second DDR memory 1626 can form a memory bank 1629.

The processor 1602 can couple to one or more I/O interfaces 1631. For example, a rear panel 1624 can comprise an Ethernet interface 1638 (such as a 10/100MBase-T (Ethernet/Fast Ethernet) interface) and an HDMI interface 1640. The processor 1602 can output 4k content to a display device with the HDMI interface 1640 via a connection 1639. The processor can transmit and/or receive data to and/or from an Ethernet PHY 1630 via a connection 1633. The Ethernet PHY 1630 connects the processor 1602 to the Ethernet interface 1638 via a connection 1631. The rear panel 1624 can also comprise a direct current (DC) power interface 1636 that connects to a PMIC 1632.

The processor 1602 can couple to a Wi-Fi-protected setup button 1642 via a connection 141 so as to provide faster and easier connection to one or more network devices.

The processor 1602 can couple to one or more antennas, including, but not limited to, a first dual band antenna 1652, a second dual band antenna 1654, a third antenna 1656 (such as a 2.4 Gigahertz (GHz) antenna), and a fourth antenna (such as a 2.4 GHz antenna). While a 2.4 GHz antenna is illustrated, the present disclosure contemplates that any one or more antennas can be tuned to operate at any one or more frequencies, such as 5 GHz, 6 GHz, 60 GHz, etc. The first dual band antenna 1652 can couple to a first diplexer 1648. The first diplexer 1648 can couple to a first front-end module (FEM) interface 1644. The first FEM interface 1644 couples to the processor 1602. Similarly, the second dual band antenna 1654 can couple to a second diplexer 1650 that can couple to a second FEM interface 1646 that can couple to the processor 1602. The first dual band antenna 1652 can comprise an on-board Wi-Fi antenna while the second dual band antenna 1654 can comprise an off-board cabled Wi-Fi antenna. The third antenna can comprise a Bluetooth antenna that couples to the processor 1602 via a connection 1657. The fourth antenna can comprise a RF4CE antenna that couples to a Zigbee controller 1618 via a connection

1615. The Zigbee controller 1618 can couple to the processor 1618 via a connection 1617.

The word "comprise" or a derivative thereof, when used in a claim, is used in a nonexclusive sense that is not intended to exclude the presence of other elements or steps in a claimed structure or method. As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. Use of the phrases "capable of," "configured to," or "operable to" in one or more embodiments refers to some apparatus, logic, hardware, and/or element designed in such a way to enable use thereof in a specified manner.

While the principles of the inventive concepts have been described above in connection with specific devices, apparatuses, systems, algorithms, programs and/or methods, it is to be clearly understood that this description is made only by way of example and not as limitation. The above description illustrates various example embodiments along with examples of how aspects of particular embodiments may be implemented and are presented to illustrate the flexibility and advantages of particular embodiments as defined by the following claims, and should not be deemed to be the only embodiments. One of ordinary skill in the art will appreciate that based on the above disclosure and the following claims, other arrangements, embodiments, implementations and equivalents may be employed without departing from the scope hereof as defined by the claims. It is contemplated that the implementation of the components and functions of the present disclosure can be done with any newly arising technology that may replace any of the above-implemented technologies. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What we claim is:

1. An ultra high definition (UHD) high dynamic range (HDR) Internet protocol (IP) client device for receiving content, the UHD HDR IP client device comprise:
   a housing, wherein the housing comprises a bottom housing, a top housing, a front panel disposed opposite a back panel, and a first side panel disposed opposite a second side panel;
   a printed circuit board (PCB) secured between the top housing and the bottom housing;
   a shield disposed at least partially about the PCB between the PCB and the top housing;
   a heat spreader disposed at least partially about the shield, wherein the heat spreader comprises a raised portion disposed above a processor of the PCB;
   an infrared (IR) device disposed at least partially within the front panel and connected to the PCB;
   an off-board cabled wireless fidelity (Wi-Fi) antenna disposed about the PCB board towards the first side panel;
   an on-board Wi-Fi antenna disposed about the PCT board towards the second side panel opposite the first side panel, wherein a coaxial cable connects the off-board cabled Wi-Fi antenna to the on-board Wi-Fi cable antenna;
   a power connector disposed at the back panel of the housing;
   a high definition multimedia interface (HDMI) disposed at the back panel;
   an Ethernet connector disposed at the back panel of the housing; and
   wherein the heat spreader comprises a heat spreader cutout so as not to cause interference with the off-board antenna.

2. The UHD HDR IP client device of claim 1, wherein the shield is a bent stamped metal.

3. The UHD HDR IP client device of claim 1, wherein the shield any of prevents, dampens, reduces, limits, or any combination thereof interference with a Wi-Fi component of the PCB.

4. The UHD HDR IP client device of claim 1, wherein the heat spreader is in contact with the shield.

5. The UHD HDR IP client device of claim 1, wherein the heat spreader is a stamped rounded beveled edge rectangular protuberance.

6. The UHD HDR IP client device of claim 1, wherein the on-board Wi-Fi antenna and the off-board cabled Wi-Fi antenna are disposed across from each other.

7. The UHD HDR IP client device of claim 1, further comprising:
   a shield frame, wherein the shield frame provides rigidity to the shield.

8. The UHD HDR IP client device of claim 7, further comprising:
   a power management integrated circuit (PMIC) shield, wherein the PMIC shield is separated by an interior wall or divider from the shield frame.

9. The UHD HDR IP client device of claim 1, further comprising:
   a Wi-Fi can shield disposed about at least one of the on-board Wi-Fi antenna, and the off-board Wi-Fi antenna.

10. The UHD HDR IP client device of claim 1, further comprising:
    a Bluetooth switch shield disposed about one or more Bluetooth components.

11. A method for providing an ultra high definition (UHD) high dynamic range (HDR) Internet protocol (IP) client device comprising a housing for receiving content, the method comprising:
    securing a printed circuit board (PCB) between a top housing and a bottom housing, wherein the housing comprises the top housing, the bottom housing, a front panel disposed opposite a back panel, and a first side panel disposed opposite a second side panel;
    disposing a shield at least partially about the PCB between the PCB and the top housing;
    disposing a heat spreader at least partially about the shield, wherein the heat spreader comprises a raised portion disposed above a processor of the PCB;
    disposing an infrared (IR) device at least partially within the front panel and connected to the PCB;
    disposing an off-board cabled wireless fidelity (Wi-Fi) antenna about the PCB board towards a first side panel of the housing, wherein the first side panel is disposed opposite a second side panel of the housing;
    disposing an on-board Wi-Fi antenna about the PCT board towards the second side panel opposite the first side panel, wherein a coaxial cable connects the off-board cabled Wi-Fi antenna to the on-board Wi-Fi cable antenna;

disposing a power connector at the back panel of the housing;

disposing a high definition multimedia interface (HDMI) at the back panel;

an Ethernet connector disposed at the back panel of the housing; and wherein the heat spreader comprises a heat spreader cutout so as not to cause interference with the off-board antenna.

12. The method of claim 11, wherein the shield is a bent stamped metal.

13. The method of claim 11, wherein the shield any of prevents, dampens, reduces, limits, or any combination thereof interference with a Wi-Fi component of the PCB.

14. The method of claim 11, wherein the heat spreader is in contact with the shield.

15. The method of claim 11, wherein the heat spreader is a stamped rounded beveled edge rectangular protuberance.

16. The method of claim 11, wherein the on-board Wi-Fi antenna and the off-board cabled Wi-Fi antenna are disposed across from each other.

17. The method of claim 11, further comprising:
disposing a shield frame within the housing, wherein the shield frame provides rigidity to the shield.

18. The method of claim 17, further comprising:
a power management integrated circuit (PMIC) shield, wherein the PMIC shield is separated by an interior wall or divider from the shield frame.

19. The UHD HDR IP client device of claim 11, further comprising:
disposing a Wi-Fi can shield about at least one of the on-board Wi-Fi antenna, and the off-board Wi-Fi antenna.

20. The UHD HDR IP client device of claim 11, further comprising:
disposing a Bluetooth switch shield about one or more Bluetooth components.

* * * * *